(12) United States Patent
Miyazawa

(10) Patent No.: US 10,554,037 B2
(45) Date of Patent: Feb. 4, 2020

(54) SEMICONDUCTOR APPARATUS

(71) Applicant: FUJI ELECTRIC CO., LTD., Kanagawa (JP)

(72) Inventor: Shigemi Miyazawa, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 311 days.

(21) Appl. No.: 15/364,182

(22) Filed: Nov. 29, 2016

(65) Prior Publication Data

US 2017/0207618 A1 Jul. 20, 2017

(30) Foreign Application Priority Data

Jan. 15, 2016 (JP) .................................. 2016-006366

(51) Int. Cl.
*H02H 3/20* (2006.01)
*H01L 29/866* (2006.01)
(Continued)

(52) U.S. Cl.
CPC ............. *H02H 3/20* (2013.01); *F02P 3/0552* (2013.01); *F02P 15/00* (2013.01);
(Continued)

(58) Field of Classification Search
CPC ......... H02H 3/20; H02H 3/202; F02P 3/0552; F02P 11/00; F02P 17/00; H01L 27/0255; H01L 27/0266; H01L 29/866
(Continued)

(56) References Cited

U.S. PATENT DOCUMENTS 4,721,869 A * 1/1988 Okado ............... H03K 17/0828
326/14
5,608,595 A * 3/1997 Gourab .............. H03K 17/0826
361/101
(Continued)

FOREIGN PATENT DOCUMENTS

JP H11289084 A 10/1999
JP 2005033611 A 2/2005
(Continued)

OTHER PUBLICATIONS

Office Action issued for counterpart Japanese Application No. 2016-006366, drafted by the Japan Patent Office dated Sep. 19, 2019.

*Primary Examiner* — Zeev V Kitov

(57) ABSTRACT

A semiconductor apparatus can block the voltage from the power source when the voltage from the power source reaches an excessive level, without requiring a larger chip size. Provided is a semiconductor apparatus including a power semiconductor element a gate of which is controlled in response to a control signal, an overvoltage detector configured to detect that a voltage at a collector terminal of the power semiconductor element reaches an overvoltage level, and a block unit configured to, in response to the detection of the overvoltage level, control the gate of the power semiconductor element to transition to an off-voltage. The semiconductor apparatus may further include a reset unit configured to, in response to that the control signal is input that turns on the power semiconductor element, output a reset signal for a predetermined period of time.

9 Claims, 8 Drawing Sheets

(51) Int. Cl.
  *F02P 15/00* (2006.01)
  *H01L 27/02* (2006.01)
  *F02P 3/055* (2006.01)
  *F02P 11/00* (2006.01)
  *F02P 17/00* (2006.01)

(52) U.S. Cl.
  CPC ...... *H01L 27/0255* (2013.01); *H01L 27/0266* (2013.01); *H01L 29/866* (2013.01); *H02H 3/202* (2013.01); *F02P 11/00* (2013.01); *F02P 17/00* (2013.01)

(58) Field of Classification Search
  USPC .......................................................... 361/91.5
  See application file for complete search history.

(56) References Cited

U.S. PATENT DOCUMENTS

| | | |
|---|---|---|
| 2001/0042886 A1 | 11/2001 | Yoshida |
| 2004/0252432 A1 | 12/2004 | Sasaki et al. |
| 2006/0077000 A1 | 4/2006 | Goudo |
| 2013/0092136 A1* | 4/2013 | Tanaya ................. F02P 15/005 123/634 |
| 2017/0117890 A1* | 4/2017 | Kanda .................. H03K 17/223 |
| 2017/0341638 A1* | 11/2017 | Sawada .................. H01L 23/36 |

FOREIGN PATENT DOCUMENTS

| | | |
|---|---|---|
| JP | 2006-074937 A | 3/2006 |
| JP | 2006109286 A | 4/2006 |
| JP | 2008045514 A | 2/2008 |
| JP | 2009-247072 A | 10/2009 |
| JP | 2011-130564 A | 6/2011 |

* cited by examiner

250

SEMICONDUCTOR APPARATUS

The contents of the following Japanese patent application are incorporated herein by reference:
NO. 2016-006366 filed on Jan. 15, 2016.

BACKGROUND

1. Technical Field

The present invention relates to a semiconductor apparatus.

2. Related Art

It is known in the conventional art that semiconductor apparatuses used, for example, to ignite internal combustion engines are formed by power semiconductor devices, which are configured to handle high power. It is known that the circuitry configured to drive such a power semiconductor device may include a protection circuit designed to detect an abnormal state of the power semiconductor device that may be caused by, for example, heating and to prevent the abnormal power semiconductor device from affecting the internal combustion engine (see, for example, Patent Documents 1 to 3).

Patent Document 1: Japanese Patent Application Publication No. 2005-6464
Patent Document 2: Japanese Patent Application Publication No. 2009-247072
Patent Document 3: Japanese Patent Application Publication No. 2006-74937

Such a protection circuit includes a detector circuit configured to detect whether the power source voltage has an overvoltage level and/or a temperature detector element configured to detect the temperature of the power semiconductor device in order to detect the abnormal state of the power semiconductor device. In order to detect whether the power source voltage has the overvoltage level, however, an extra terminal is required to input the power source voltage, which may require an increased area for the chip of the power semiconductor device. In addition, when the temperature detector element is provided, errors may be included in the detected results due to the manufacturing-process-induced variability in detected temperature of the temperature detector element.

SUMMARY

Therefore, it is an object of an aspect of the innovations herein to provide a semiconductor apparatus, which is capable of overcoming the above drawbacks accompanying the related art. The above and other objects can be achieved by combinations described in the claims. A first aspect of the innovations herein provide a semiconductor apparatus including a power semiconductor element a gate of which is controlled in response to a control signal, an overvoltage detector configured to detect that a voltage at a collector terminal of the power semiconductor element reaches an overvoltage level, and a block unit configured to, in response to the detection of the overvoltage level, control the gate of the power semiconductor element to transition to an off-voltage.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
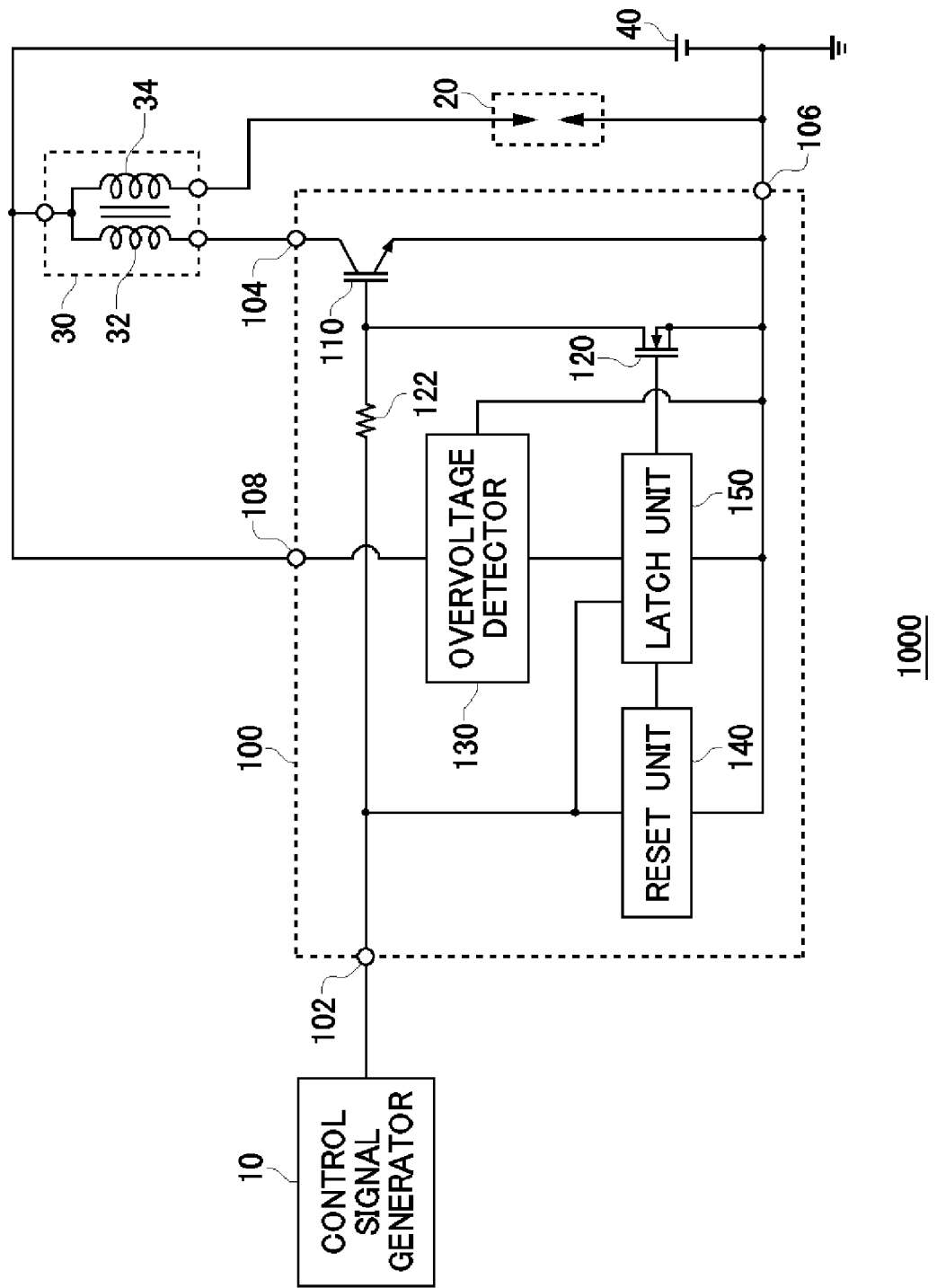
FIG. 1 shows an exemplary structure of an ignition apparatus 1000 relating to an embodiment of the present invention.

FIG. 1 shows an exemplary structure of an ignition apparatus 1000 relating to an embodiment of the present invention. The ignition apparatus 1000 is configured to ignite an ignition plug for use with an internal combustion engine of an automobile, and the like. In the present embodiment, an exemplary case is described where the ignition apparatus 1000 is installed in an automobile engine. The ignition apparatus 1000 includes a control signal generator 10, an ignition plug 20, an ignition coil 30, a power source 40 and a semiconductor apparatus 100.

The control signal generator 10 is designed to generate a switching control signal to switch on and off the semiconductor apparatus 100. The control signal generator 10 is, for example, part of or an engine control unit (ECU) of an automobile in which the ignition apparatus 1000 is installed. The control signal generator 10 feeds the generated control signal to the semiconductor apparatus 100. In response to the control signal generator 10 feeding the control signal to the semiconductor apparatus 100, the ignition apparatus 1000 starts igniting the ignition plug 20.

The ignition plug 20 discharges to generate electric sparks. The ignition plug 20 discharges when applied with a voltage of approximately 10 kV or higher, for example. The ignition plug 20 is, for example, installed within an internal combustion engine. In this case, the ignition plug 20 ignites a combustible gas such as a gas mixture within a combustion chamber. The ignition plug 20 is, for example, disposed in a through hole connecting together the outside of the cylinder and the combustion chamber within the cylinder and secured in a manner to seal the through hole. One of the ends of the ignition plug 20 is exposed within the combustion chamber and the other receives an electrical signal from the outside of the cylinder.

The ignition coil 30 feeds the electrical signal to the ignition plug 20. The ignition coil 30 feeds, as the electrical signal, a high voltage sufficient to cause the ignition plug 20 to discharge. The ignition coil 30 may function as a transformer, and may be an ignition coil including a primary coil 32 and a secondary coil 34, for example. One of the ends of the primary coil 32 is electrically connected to one of the ends of the secondary coil 34. The primary coil 32 has a smaller number of windings than the secondary coil 34 and shares the core with the secondary coil 34. The secondary coil 34 generates electromotive force (electromotive force generated by mutual induction) according to the electromotive force generated in the primary coil 32. The other end of the secondary coil 34 is connected to the ignition plug 20, so that the generated electromotive force is fed to the ignition plug 20 to cause the ignition plug 20 to discharge.

The power source 40 feeds a voltage to the ignition coil 30. For example, the power source 40 feeds a predetermined constant voltage Vb (for example, 14 V) to one of the ends of the primary coil 32 and one of the ends of the secondary coil 34. The power source 40 is, for example, a battery of an automobile.

The semiconductor apparatus 100 allows or stops the current flow between the other end of the primary coil 32 of the ignition coil 30 and the reference potential, in response to the control signal fed from the control signal generator 10. For example, the semiconductor apparatus 100 allows the current flow between the primary coil 32 and the reference potential when the control signal has HIGH potential (on-potential) and stops the current flow between the primary coil 32 and the reference potential when the control signal has LOW potential (off-potential).

Here, the reference potential may be the reference potential in the control system of the automobile, or the reference potential for the semiconductor apparatus 100 in the automobile. The reference potential may be equal to LOW potential that is designed to turn off the semiconductor apparatus 100, for example, 0 V. The semiconductor apparatus 100 includes a control terminal 102, a first terminal 104, a second terminal 106, a third terminal 108, a power semiconductor element 110, a block unit 120, a resistance 122, an overvoltage detector 130, a reset unit 140 and a latch unit 150.

The control terminal 102 receives a control signal designed to control the power semiconductor element 110. The control terminal 102 is connected to the control signal generator 10 and receives the control signal. The first terminal 104 is connected to the power source 40 via the ignition coil 30. The second terminal 106 is connected to the reference potential. In other words, the first terminal 104 is a terminal on a higher potential side than the second terminal 106 and the second terminal 106 is a terminal on a lower potential side than the first terminal 104. The third terminal 108 is connected between the power source 40 and the ignition coil 30.

The power semiconductor element 110 has a gate terminal (G), a collector terminal (C) and an emitter terminal (E). The collector and emitter terminals are electrically connected to each other or disconnected from each other in response to the control signal to be input into the gate terminal. The power semiconductor element 110 is connected between the first terminal 104 having a higher potential and the second terminal 106 having a lower potential and turned on or off in response to the gate potential. The gate of the power semiconductor element 110 is controlled in response to the control signal.

For example, the power semiconductor element 110 is an insulated gate bipolar transistor (IGBT). Alternatively, the power semiconductor element 110 may be a MOSFET. For example, the emitter terminal of the power semiconductor element 110 is connected to the reference potential. In addition, the collector terminal of the power semiconductor element 110 is connected to the other end of the primary coil 32. The present exemplary embodiment describes an example where the power semiconductor element 110 is an n-channel IGBT that establishes electrical connection between the collector terminal and the emitter terminal in response to the transition of the control signal to the on-potential.

The block unit 120 is connected between the gate terminal of the power semiconductor element 110 and the reference potential. The block unit 120 is, for example, an FET where the connection between the drain terminal and the source terminal is established and disconnected according to the gate potential. The block unit 120 is connected to the gate terminal of the power semiconductor element 110 at the drain terminal thereof and to the reference potential at the source terminal thereof, and configured to switch whether the control signal received from the control terminal 102 is fed to the gate terminal of the power semiconductor element 110. The block unit 120 is, for example, a normally-off switch element that establishes electrical connection between the drain terminal and the source terminal in response to the transition of the potential of the gate terminal to HIGH potential. In this case, the block unit 120 is preferably an n-channel MOSFET.

The resistance 122 is connected between the control terminal 102 and the gate terminal of the power semiconductor element 110. The resistance 122 feeds the control signal to the gate terminal of the power semiconductor element 110 when the block unit 120 is in the OFF state. The resistance 122 lowers the voltage of the control signal when the block unit 120 is in the ON state and thus allows the control signal to flow into the reference potential. In this manner, the gate terminal of the power semiconductor element 110 receives the reference potential.

The overvoltage detector 130 detects that the voltage input into the power semiconductor element 110 has an overvoltage level. The overvoltage detector 130, for example, detects whether the voltage input into the power semiconductor element 110 has an overvoltage level based on the potential between the ignition coil 30 and the power source 40. The overvoltage detector 130, for example, detects whether the voltage input into the power semiconductor element 110 has an overvoltage level by comparing the input potential against a threshold. For example, the overvoltage detector 130 outputs HIGH potential as a detection signal when detecting that the voltage input into the power semiconductor element 110 has an overvoltage level, and outputs LOW potential as a detection signal when detecting that the voltage input into the power semiconductor element 110 does not has the overvoltage level. The overvoltage detector 130 feeds the detection signal to the latch unit 150.

The reset unit 140 outputs a reset signal lasting for a predetermined period of time in response to reception of a control signal that turns on the power semiconductor element 110. The reset unit 140 is, for example, connected to the control signal generator 10 and outputs a reset signal of HIGH potential in response to reception of a control signal of HIGH potential. The reset unit 140 outputs as the reset signal a pulse signal having a predetermined pulse width, for example. The reset unit 140 feeds the reset signal to the latch unit 150.

The latch unit 150 is reset according to the reset signal and latches detection of an overvoltage. The latch unit 150 generates a block signal in response to that the voltage input into the power semiconductor element 110 has an overvoltage level, and feeds the block signal to the gate terminal of the block unit 120. The latch unit 150 is, for example, connected to the overvoltage detector 130 and outputs the block signal in response to detection of an overvoltage at the power semiconductor element 110. In other words, the latch unit 150 blocks the feeding of the control signal from the control terminal 102 to the power semiconductor element 110 in response to detection of an overvoltage at the power semiconductor element 110. The latch unit 150 generates a block signal that transitions from LOW potential to HIGH potential, for example. In this manner, the power semiconductor element 110 is switched off.

According to the semiconductor apparatus 100 relating to the above-described embodiment, the power semiconductor element 110 is in the ON state if the power semiconductor element 110 is in the normal state and the control signal has HIGH potential. In this case, a collector current Ic flows from the power source 40 through the primary coil 32 of the ignition coil 30. The change rate over time dIc/dt for the collector current Ic is determined by the inductance of the primary coil 32 and the voltage fed from the power source 40 and the collector current Ic increases up to a predetermined (or predesignated) current value. For example, the collector current Ic increases up to approximately several amperes, a dozen amperes or several dozen amperes.

When the control signal transitions to LOW potential, the power semiconductor element 110 is turned off and the collector current drastically drops. The dramatic decrease in the collector current drastically increases the voltage across the primary coil 32 due to the electromotive force generated by self induction, which generates induction and resultantly electromotive force of up to approximately several dozen kilovolts across the secondary coil 34. The thus-generated voltage across the secondary coil 34 is fed to the ignition plug 20 in order to cause the ignition plug 20 to discharge to ignite the combustible gas in the ignition apparatus 1000.

Here, if the voltage applied to the first terminal 104 of the power semiconductor element 110 has an overvoltage level, the block unit 120 blocks the feeding of the control signal from the control terminal 102 to the power semiconductor element 110. As a result, the gate potential of the power semiconductor element 110 transitions to the off-potential, which blocks the collector current Ic. Here, if the ignition apparatus 1000 is installed in an automobile or the like and the battery terminal is released while the automobile is in operation, the ignition apparatus 1000 may enter a failure mode (referred to as "load dump") where the induction-induced electromotive force is generated in the ignition coil 30 and the potential accordingly temporarily increases. According to the present embodiment, even if the ignition apparatus 1000 enters such a failure mode and an overvoltage resultantly occurs, the block unit 120 can block the feeding of the control signal to the power semiconductor element 110 and thus blocks the collector current Ic. Thus, the ignition apparatus 1000 and the components of the automobile can be prevented from breaking down, malfunctioning and the like.

According to the above-described example, the semiconductor apparatus 100 includes the third terminal 108 that is connected to the ignition coil 30 in order to detect whether an overvoltage occurs in the power semiconductor element 110. As described above, the semiconductor apparatus 100 can detect an overvoltage by having a terminal that is configured to receive a voltage that needs to be detected. Therefore, the semiconductor apparatus 100 requires a physical region to mount the terminal thereon, to provide a transmission circuit or to provide a protection circuit for the signal input through the terminal, or the like. For these reasons, the semiconductor apparatus 100 may require an increased chip area even when formed in integrated circuits or the like.

Alternatively, the semiconductor apparatus 100 may be provided with, in place of the overvoltage detector 130 shown in FIG. 1, a temperature detector or the like to detect the temperature of the power semiconductor element 110. In this case, the semiconductor apparatus 100 can detect the temperature rise caused when the power semiconductor element 110 encounters load dump and block the collector current according to the result of the detection. The temperature detector, however, suffers from manufacturing-process-induced variability in, for example, sensitivity for temperature detection. Thus, the result of the detection needs to be calibrated and corrected for each semiconductor apparatus 100, which requires a lot of cost and efforts.

Considering the above, a semiconductor apparatus 200 relating to an embodiment of the present invention is configured to be capable of blocking the collector current in accordance with the overvoltage in the power semiconductor element 110 without requiring any terminals for overvoltage detection, at reduced cost and with less effort. An ignition apparatus 2000 including such a semiconductor apparatus 200 will be described with reference to FIG. 2.

Figure 2:
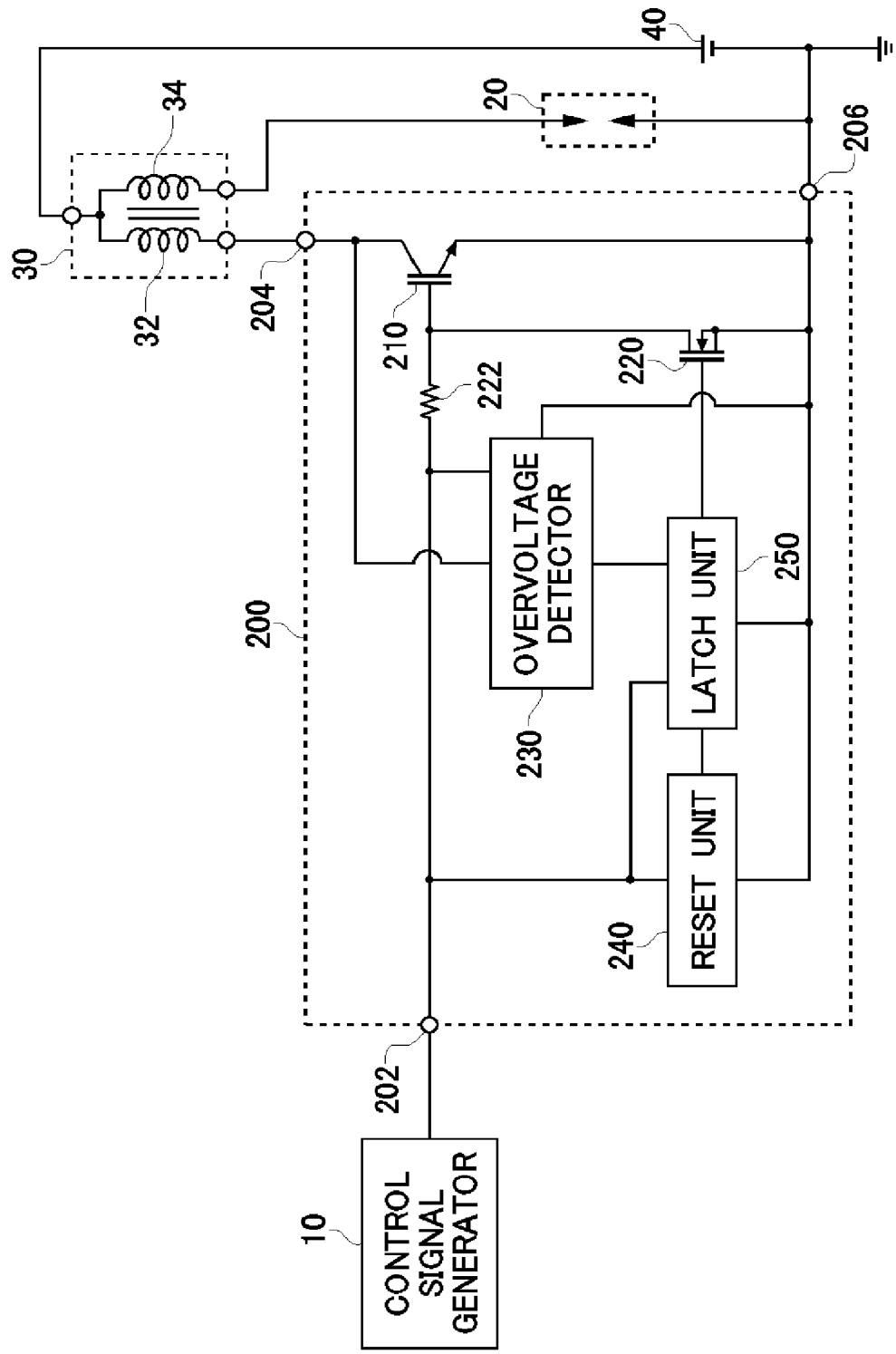
FIG. 2 shows an exemplary structure of an ignition apparatus 2000 relating to an embodiment of the present invention.

FIG. 2 shows an exemplary structure of the ignition apparatus 2000 relating to an embodiment of the present invention. The ignition apparatus 2000 shown in FIG. 2 has substantially the same components as the ignition apparatus 1000 relating to the embodiment shown in FIG. 1, and such components are assigned with the same reference numerals and not described here. The ignition apparatus 2000 includes the semiconductor apparatus 200. Here, the control signal generator 10, the ignition plug 20, the ignition coil 30 and the power source 40 included in the ignition apparatus 2000 are not described here.

The semiconductor apparatus 200 includes a control terminal 202, a first terminal 204, a second terminal 206, a power semiconductor element 210, a block unit 220, a resistance 222, an overvoltage detector 230, a reset unit 240 and a latch unit 250. The control terminal 202 receives a control signal designed to control the power semiconductor element 210. The control terminal 202 is connected to the control signal generator 10 and receives the control signal. The first terminal 204 is connected to the power source 40 via the ignition coil 30. The second terminal 206 is connected to the reference potential. In other words, the first terminal 204 is a terminal on a higher potential side than the second terminal 206 and the second terminal 206 is a terminal on a lower potential side than the first terminal 204.

The power semiconductor element 210 has a gate terminal (G), a collector terminal (C) and an emitter terminal (E). The collector and emitter terminals are electrically connected to each other or disconnected from each other in response to the control signal to be input into the gate terminal. The power semiconductor element 210 is connected between the first terminal 204 having a higher potential and the second terminal 206 having a lower potential and turned on or off in response to the gate potential. The gate of the power semiconductor element 210 is controlled in response to the control signal.

For example, the power semiconductor element 210 is an insulated gate bipolar transistor (IGBT). The power semiconductor element 210 has a breakdown voltage as high as several hundred volts, for example. The power semiconductor element 210 is, for example, a vertically-structured device having the collector electrode on a first surface side of a substrate and the gate electrode and the emitter electrode on a second surface side of the substrate that faces away from the first surface side. Alternatively, the power semiconductor element 210 may be a vertical MOSFET. For example, the emitter terminal of the power semiconductor element 210 is connected to the reference potential. In addition, the collector terminal of the power semiconductor element 210 is connected to the other end of the primary coil 32. The present exemplary embodiment describes an example where the power semiconductor element 210 is an n-channel IGBT that establishes electrical connection between the collector terminal and the emitter terminal in response to the transition of the control signal to the on-potential.

The block unit 220 controls the voltage at the gate of the power semiconductor element 210 to transition to the off-voltage in response to detection of an overvoltage. The block unit 220 is connected between the gate terminal of the power semiconductor element 210 and the reference potential. The block unit 220 is, for example, an FET where the connection between the drain terminal and the source terminal is established and disconnected according to the gate potential. The block unit 220 is connected to the gate terminal of the power semiconductor element 210 at the drain terminal thereof and to the reference potential at the source terminal thereof, and configured to switch whether the control signal received from the control terminal 202 is fed to the gate terminal of the power semiconductor element 210. The block unit 220 is, for example, a normally-off switch element that establishes electrical connection between the drain terminal and the source terminal in response to the transition of the potential of the gate terminal to HIGH potential. In this case, the block unit 220 is preferably an n-channel MOSFET.

The resistance 222 is connected between the control terminal 202 and the gate terminal of the power semiconductor element 210. The resistance 222 feeds the control signal to the gate terminal of the power semiconductor element 210 when the block unit 220 is in the OFF state. The resistance 222 lowers the voltage of the control signal when the block unit 220 is in the ON state and allows the control signal to flow into the reference potential. In other words, the gate terminal of the power semiconductor element 210 receives the reference potential.

The overvoltage detector 230 detects that the voltage at the collector terminal side of the power semiconductor element 210 has an overvoltage level. The overvoltage detector 230, for example, detects whether the voltage input into the power semiconductor element 210 has an overvoltage level based on the potential between the primary coil 32 and the first terminal 204. The overvoltage detector 230 may receive the potential at the collector terminal of the power semiconductor element 210 via a resistance or the like. In other words, the overvoltage detector 230 detects whether the overvoltage level is reached based on the potential at the portion within the semiconductor apparatus 200 that is connected to the collector terminal.

The overvoltage detector 230, for example, detects whether the voltage input into the power semiconductor element 210 has an overvoltage level by comparing the input potential against a threshold. In this case, the overvoltage detector 230 may include a voltage divider circuit including a plurality of resistances, and a comparator circuit including a comparator. For example, the overvoltage detector 230 outputs, as a detection signal, HIGH potential when detecting that the voltage input into the power semiconductor element 210 has an overvoltage level, and output, as the detection signal, LOW potential when detecting that the voltage input into the power semiconductor element 210 does not reach the overvoltage level. The overvoltage detector 230 feeds the detection signal to the latch unit 250.

The reset unit 240 outputs a reset signal lasting for a predetermined period of time in response to reception of a control signal that turns on the power semiconductor element 210. The reset unit 240 is, for example, connected to the control signal generator 10 and outputs a reset signal of HIGH potential in response to reception of a control signal of HIGH potential. The reset unit 240 outputs as the reset signal a pulse signal having a predetermined pulse width. The reset unit 240 feeds the reset signal to the latch unit 250.

The latch unit 250 is reset according to the reset signal and latches detection of an overvoltage. The latch unit 250 generates a block signal in response to that the voltage input into the power semiconductor element 210 has an overvoltage level and feeds the block signal to the gate terminal of the block unit 220. The latch unit 250 is, for example, connected to the overvoltage detector 230 and outputs the block signal in response to detection of an overvoltage at the power semiconductor element 210. In other words, the latch unit 250 blocks the feeding of the control signal from the control terminal 202 to the power semiconductor element 210 in response to detection of an overvoltage at the power semiconductor element 210.

The latch unit 250 generates a block signal that transitions from LOW potential to HIGH potential, for example. In this manner, the block unit 220 controls the voltage at the gate of the power semiconductor element 210 to transition to an off-voltage in response to that the latch unit 250 latches detection of an overvoltage. In other words, the block unit 220 pulls down the gate of the power semiconductor element 210 in response to detection of an overvoltage, which switches off the power semiconductor element 210.

According to the semiconductor apparatus 200 relating to the above-described embodiment, similarly to the semiconductor apparatus 100 described with reference to FIG. 1, the power semiconductor element 110 is in the ON state if the power semiconductor element 210 is in the normal state and the control signal has HIGH potential. In this manner, the ignition apparatus 2000 can cause the ignition plug 20 to discharge in order to ignite the combustible gas as described with reference to FIG. 1.

When an overvoltage is fed to the power semiconductor element 210, the overvoltage detector 230 detects the overvoltage and the block signal is fed to the block unit 220. This causes the gate potential of the power semiconductor element 210 to transition to the off-potential, which blocks the collector current Ic. Since the overvoltage detector 230 relating to the present embodiment can detect whether the overvoltage level is reached based on the voltage within the semiconductor apparatus 200 as described above, the semiconductor apparatus 200 can detect the overvoltage and block the collector current Ic without requiring a terminal to receive a voltage fed from outside.

According to the present embodiment, the overvoltage detector 230 can detect the voltage input into the first terminal 204. Here, the input voltage significantly varies due to the ignition sequence performed by the semiconductor apparatus 200, and the like. Stated differently, the overvoltage detector 230 may possibly detect an overvoltage even when the power semiconductor element 210 is not abnormally heated.

To address this issue, in the present embodiment, the reset unit 240 generates the reset signal to mark the timing at which it should be started to detect whether the power semiconductor element 210 is in the abnormal state, and the latch unit 250 latches the result of the detection done by the overvoltage detector 230 during a detection period that starts at the timing marked by the reset signal and ends when the control signal reaches LOW potential. In this manner, the semiconductor apparatus 200 can detect overvoltage in the power semiconductor element 210 even based on the voltage at the first terminal 204, which varies significantly when compared with the output from the power source 40. The exemplary structures of the above-described overvoltage detector 230, reset unit 240 and latch unit 250 will be described in the following.

Figure 3:
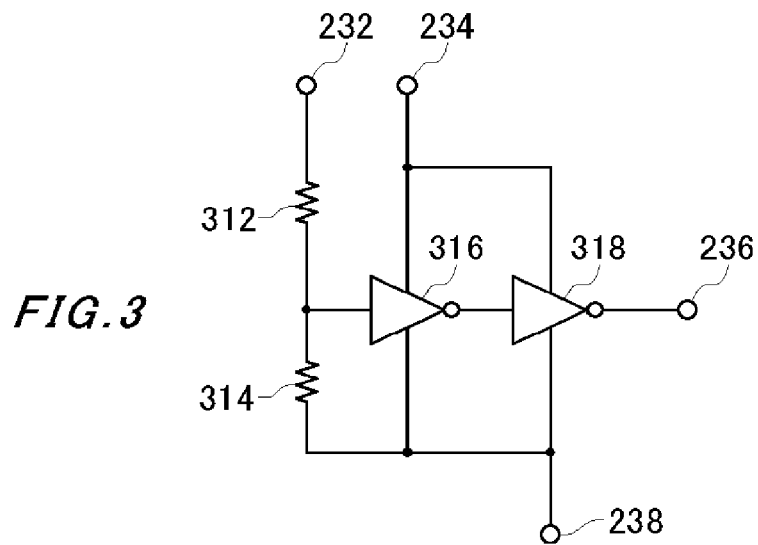
FIG. 3 shows a first exemplary structure of an overvoltage detector 230 relating to an embodiment of the present invention.

FIG. 3 shows a first exemplary structure of an overvoltage detector 230 relating to an embodiment of the present invention. The overvoltage detector 230 includes a voltage input section 232, a power source input section 234, a detection signal output section 236, a reference potential input section 238, a resistance 312, a resistance 314, an inverter 316 and an inverter 318.

The voltage input section 232 receives a voltage signal that should be subjected to overvoltage detection. In other words, the voltage input section 232 receives the voltage at the collector terminal side of the power semiconductor element 210. The power source input section 234 is connected to the power source for the overvoltage detector 230. The power source input section 234 receives as the operating voltage the control signal input from the control terminal 202, for example. In this way, the overvoltage detector 230 detects whether the voltage input through the voltage input section 232 has an overvoltage level if the control signal has HIGH potential, in other words, under such a condition that the power semiconductor element 210 is in the ON state.

The detection signal output section 236 outputs the result of the detection done by the overvoltage detector 230. The detection signal output section 236 is, for example, connected to the latch unit 250 and outputs HIGH potential as a result of detecting an overvoltage. The reference potential input section 238 is connected to the reference potential.

The resistances 312 and 314 are connected in series between the voltage input section 232 and the reference potential input section 238 and configured to divide the voltage received from the detection signal output section 236. The resistances 312 and 314 respectively have resistance values between which a predetermined resistance ratio is set. The resistance ratio between the resistances 312 and 314 may be determined in such a manner that the voltage-divided potential across the resistance 314 serves as HIGH potential when the voltage input through the voltage input section 232 exceeds a threshold or has an overvoltage level, for example.

The inverter 316 receives the potential between the resistance 312 and the resistance 314 (herein, the potential will be referred to as the "voltage-divided potential) and inverts the logic of the voltage-divided potential. To be specific, the inverter 316 outputs LOW potential when the voltage input through the voltage input section 232 has an overvoltage level. The inverter 318 inverts the logic of the output from the inverter 316. To be specific, the inverter 318 outputs HIGH potential when the voltage input from the voltage input section 232 has an overvoltage level.

As described above, the overvoltage detector 230 relating to the present embodiment outputs an overvoltage detection signal of HIGH potential if the voltage input through the voltage input section 232 has an overvoltage level under such a condition that the power semiconductor element 210 is in the ON state. According to the exemplary structure of the overvoltage detector 230 shown in FIG. 3, the overvoltage detector 230 includes the voltage divider resistances and inverters and the voltage divider resistances generate the threshold voltage. Alternatively, the overvoltage detector 230 may include voltage divider resistances and a comparator. In this case, the overvoltage detector 230 uses the comparator to compare the voltage-divided potential against a threshold and outputs HIGH potential when the potential produced by the voltage division is higher than the threshold. It should be noted that the threshold voltage input into the comparator may be generated by the voltage divider resistances.

Figure 4:
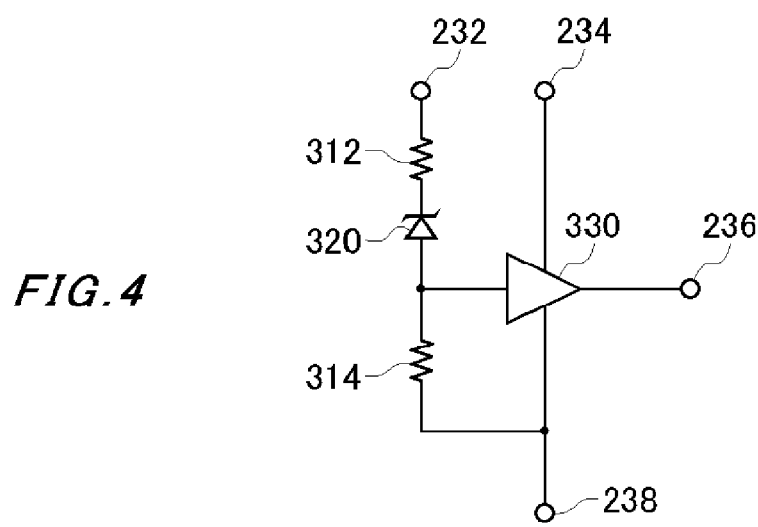
FIG. 4 shows a second exemplary structure of the overvoltage detector 230 relating to an embodiment of the present invention.

In addition, the overvoltage detector 230 may include a zener diode. Such an overvoltage detector 230 will be described with reference to FIG. 4. FIG. 4 shows a second exemplary structure of the overvoltage detector 230 relating to an embodiment of the present invention. The overvoltage detector 230 shown in FIG. 4 has substantially the same components as the overvoltage detector 230 relating to the embodiment shown in FIG. 3, and such components are assigned with the same reference numerals and not described here.

The overvoltage detector 230 includes a zener diode 320 and a buffer 330. The zener diode 320 is connected between the resistance 312 and the resistance 314, and allows currents to flow between the resistance 312 and the resistance 314 when the voltage input through the voltage input section 232 exceeds the breakdown voltage. The breakdown voltage of the zener diode 320 is determined to, for example, correspond to the threshold with reference to which the voltage input through the voltage input section 232 is judged whether to have an overvoltage level. In this manner, if the voltage input through the voltage input section 232 has an overvoltage level, currents flow into the resistance 314, and the voltage-divided potential, which is generated between the zener diode 320 and the resistance 314, is treated as HIGH potential.

The buffer 330 is connected between the zener diode 320 and the resistance 314 and buffers the voltage-divided potential across the resistance 314. In other words, the buffer 330 outputs HIGH potential if the voltage input through the voltage input section 232 has an overvoltage level. The buffer 330 uses, as the operating voltage, the control signal input through the power source input section 234. In this manner, under the condition that the power semiconductor element 210 is in the ON state, the overvoltage detector 230 shown in FIG. 4 outputs an overvoltage detection signal of HIGH potential if the voltage input through the voltage input section 232 has an overvoltage level.

Figure 5:
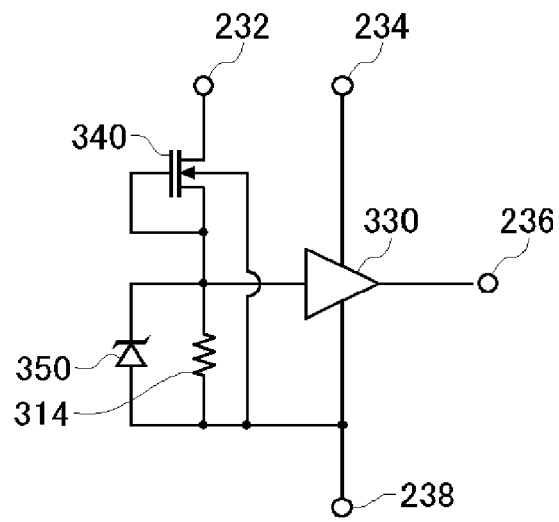
FIG. 5 shows a third exemplary structure of the overvoltage detector 230 relating to an embodiment of the present invention.

Alternatively, the overvoltage detector 230 may include a depletion-mode MOSFET. Such a overvoltage detector 230 will be described with reference to FIG. 5. FIG. 5 shows a third exemplary structure of the overvoltage detector 230 relating to an embodiment of the present invention. The overvoltage detector 230 shown in FIG. 5 has substantially the same components as the overvoltage detector 230 relating to the embodiment shown in FIG. 3, and such components are assigned with the same reference numerals and not described here.

The overvoltage detector 230 includes a depletion-mode MOSFET 340 and a zener diode 350. The depletion-mode MOSFET 340 is provided in place of the resistance 312 of the overvoltage detector 230 shown in FIG. 3. The depletion-mode MOSFET 340 is, for example, connected at the drain terminal thereof to the voltage input section 232, at the source terminal thereof to the resistance 314 and at the gate terminal thereof to the source terminal thereof, so as to behave like a resistance between the drain and the source. In this manner, as with the voltage division achieved by the resistance 312 and the resistance 314 described with reference to FIG. 4, the resistance value of the resistance 314 may be determined in such a manner that the voltage-divided potential across the resistance 314 serves as HIGH potential if the voltage input through the voltage input section 232 exceeds a threshold and thus has an overvoltage level.

The zener diode 350 is connected between one of the ends of the resistance 314 and the other. When the voltage-divided potential across the resistance 314 exceeds the breakdown voltage, the zener diode 350 electrically connects one of the ends of the resistance 314 and the other. Stated differently, if the voltage input through the voltage input section 232 exceeds a threshold and has an overvoltage level, the zener diode 350 prevents an excessive voltage from being applied to the resistance 314. The breakdown voltage of the zener diode 350 is, for example, set to a voltage level that is approximately equal to HIGH voltage or higher than HIGH voltage by approximately several volts.

In this manner, if the voltage input through the voltage input section 232 has an overvoltage level, currents flow into the resistance 314 and the voltage-divided potential, which is generated between the zener diode 320 and the resistance 314, is treated as HIGH potential. The buffer 330 is connected between the depletion-mode MOSFET 340 and the resistance 314 and buffers the voltage-divided potential across the resistance 314. In this manner, under the condition that the power semiconductor element 210 is in the ON state, the overvoltage detector 230 shown in FIG. 5 outputs an overvoltage detection signal of HIGH potential if the voltage input through the voltage input section 232 has an overvoltage level. As described above, the overvoltage detector 230 may include at least one of a resistance, a zener diode, a depletion-mode MOSFET and an inverter to generate a threshold voltage based on which an overvoltage is determined.

Figure 6:
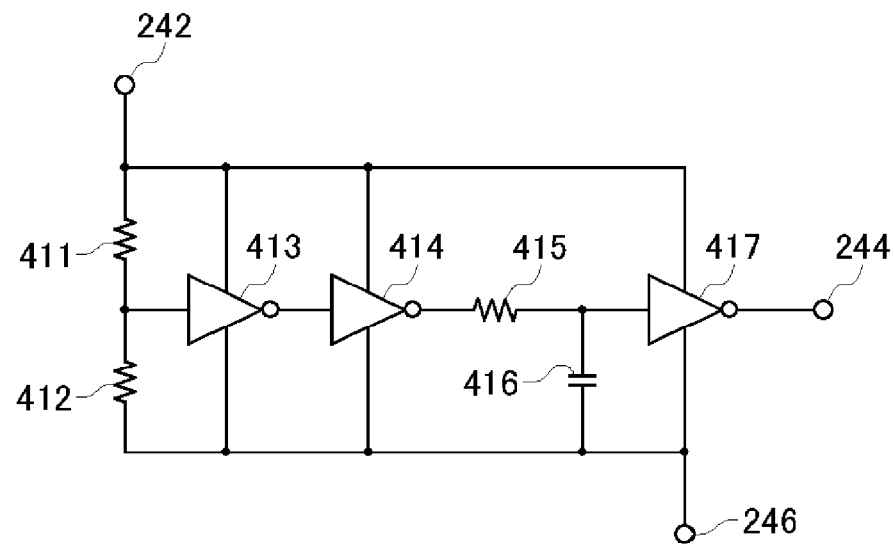
FIG. 6 shows an exemplary structure of a reset unit 240 relating to an embodiment of the present invention.

FIG. 6 shows an exemplary structure of a reset unit 240 relating to an embodiment of the present invention. The reset unit 240 includes a control signal input section 242, a reset signal output section 244, a reference potential input section 246, a resistance 411, a resistance 412, an inverter 413, an inverter 414, a resistance 415, a capacitor 416 and an inverter 417.

The control signal input section 242 receives a control signal input from the control terminal 202. The reset signal output section 244 outputs a reset signal generated by the reset unit 240. The reference potential input section 246 is connected to the reference potential.

The resistance 411 and the resistance 412 are connected in series between the control signal input section 242 and the reference potential input section 246, and divide the voltage of the control signal Vin input through the control signal input section 242. When R1 denotes the resistance value of the resistance 411 and R2 denotes the resistance value of the resistance 412, the voltage-divided potential can be represented as Vin·R2/(R1+R2). For example, if the control signal linearly rises from the off-potential (0 V) to the on-potential (5 V) transiently, the voltage-divided potential also linearly rises from 0 V to 5×R2/(R1+R2).

The inverter 413 is connected between the resistance 411 and the resistance 412, and configured to receive the voltage-divided potential and outputs the inverted signal. The inverter 414 receives the output from the inverter 413 and outputs the inverted signal. The resistance 415 and the capacitor 416 together form an RC circuit, which receives the output from the inverter 414 and outputs a signal whose rising edge is delayed by the time constant RC. The inverter 417 receives the output from the resistance 415 and the capacitor 416 and outputs the inverted signal.

Here, the inverter 413, the inverter 414 and the inverter 417 operate using the control signal input through the control signal input section 242 as their power source. Therefore, each inverter outputs a signal having substantially the same potential as the control signal while the control signal transiently rises and until the control signal reaches the threshold for each inverter. In the present example, each inverter has substantially the same threshold Vthi. The behaviors of the respective components of the above-described reset unit 240 will be described with reference to FIG. 7.

Figure 7:
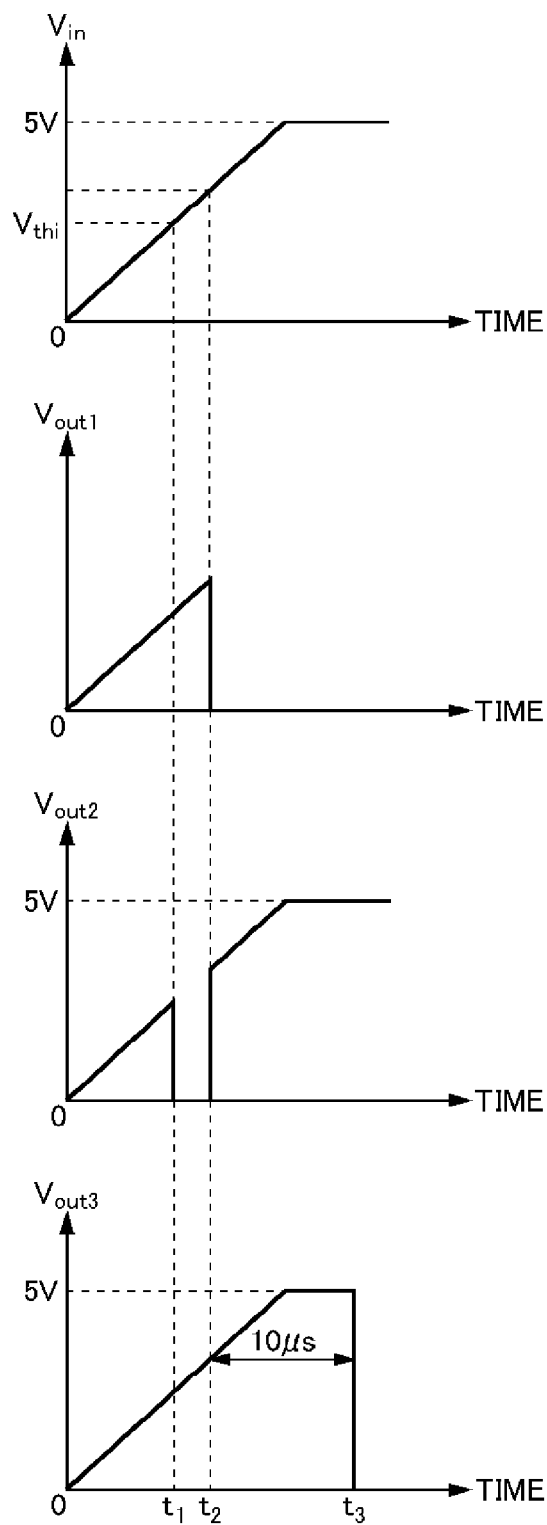
FIG. 7 shows an exemplary waveform illustrating how each component of the reset unit 240 operates in accordance with an embodiment of the present invention.

FIG. 7 shows an exemplary waveform illustrating how each component of the reset unit 240 relating to an embodiment of the present invention operates. In FIG. 7, the horizontal axis represents the time and the vertical axis represents the output potential. FIG. 7 shows, as an example, the output potentials from the inverter 413, the inverter 414 and the inverter 417 observed when the control signal Vin input into the control signal input section 242 linearly rises from the off-potential (0 V) to the on-potential (5 V). The output potentials Vout1, Vout2 and Vout3 from the inverters 413, 414 and 417 remain substantially equal to the power source potential (in other words, the control signal Vin) until the input potential reaches the thresholds of the respective inverters.

Even if the power source potential exceeds the threshold Vthi, the voltage-divided potential input into the inverter 413 Vin·R2/(R1+R2) is equal to or lower than the threshold Vthi. Therefore, the potential input into the inverter 413 is LOW potential and the output from the inverter 413 is HIGH potential. Here, if the power source potential is at a transient level and has not yet reached HIGH potential (for example, 5 V), the inverter 413 outputs as HIGH potential the transient level regardless whether the inverter 413 operates to output HIGH potential. FIG. 7 shows an exemplary case where the output potential Vout1 of the inverter 413 is at substantially the same level as the power source potential Vin after a time t1.

The inverter 413 provides LOW potential as the inverted output in response to that the potential of the power source exceeds the threshold Vthi and the input voltage-divided potential exceeds the threshold Vthi (in other words, in response to reception of HIGH potential). FIG. 7 shows an exemplary case where the output potential Vout1 of the inverter 413 transitions to LOW potential (0 V) at a time t2.

The inverter 414 outputs LOW potential in response to that the potential of the power source exceeds the threshold Vthi and the input potential also exceeds the threshold Vthi. FIG. 7 shows an exemplary cases where the output potential Vout2 of the inverter 414 transitions to LOW potential at the time t1. The inverter 414 outputs HIGH potential in response to that the potential of the power source exceeds the threshold Vthi and the input potential reaches LOW potential. If the power source potential is at a transient level and has not yet reached HIGH potential, the inverter 414 outputs as HIGH potential the transient level. FIG. 7 shows an exemplary case where the output potential Vout2 of the inverter 414 is at substantially the same level as the power source potential Vin after the time t2.

The RC circuit formed by the resistance 415 and the capacitor 416 delays the output signal from the inverter 414. FIG. 7 shows an exemplary case where the RC circuit delays the output signal by 10 µs. The inverter 417 outputs LOW potential in response to that the potential of the power source exceeds the threshold Vthi and the input potential also exceeds the threshold Vthi. FIG. 7 shows an exemplary case where the output potential Vout3 of the inverter 417 is LOW potential at a time t3.

As described above, the reset unit 240 relating to the present embodiment outputs the reset signal after the reference time t2 has elapsed after the on-potential is input into the control signal input section 242. The reset signal shown in FIG. 7 is, for example, a pulse signal that has a pulse width equal to the time constant set by the resistance 415 and the capacitor 416.

Figure 8:
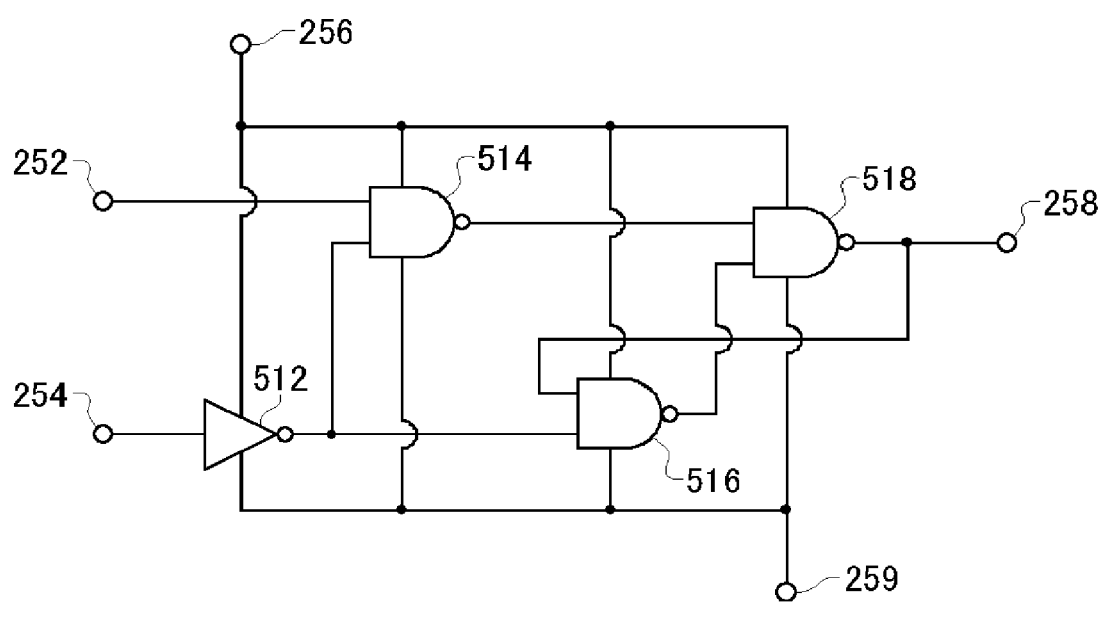
FIG. 8 shows an exemplary structure of a latch unit 250 relating to an embodiment of the present invention.

FIG. 8 shows an exemplary structure of the latch unit 250 relating to an embodiment of the present invention. The latch unit 250 includes a set signal input section 252, a reset signal input section 254, a control signal input section 256, a block signal output section 258, a reference potential input section 259, an inverter 512, a first NAND circuit 514, a second NAND circuit 516 and a third NAND circuit 518.

The set signal input section 252 is connected to the detection signal output section 236 of the overvoltage detector 230 and receives the overvoltage detection signal. The reset signal input section 254 is connected to the reset signal output section 244 of the reset unit 240 and receives the reset signal. The control signal input section 256 receives the control signal input from the control terminal 202. The block signal output section 258 outputs the block signal generated by the latch unit 250. The reference potential input section 259 is connected to the reference potential.

The inverter 512, the first NAND circuit 514, the second NAND circuit 516 and the third NAND circuit 518 respectively operate using as the power source the control signal input through the control signal input section 256. Accordingly, under such a condition that the control signal has HIGH potential, the latch unit 250 latches the detection of the block requirement and outputs the block signal. The following describes how the latch unit 250 behaves when the control signal transitions to HIGH potential.

The inverter 512 inverts the logic of the reset signal and outputs the inverted reset signal to the first NAND circuit 514 and the second NAND circuit 516. The first NAND circuit 514 receives the output from the inverter 512 and the overvoltage detection signal, performs an NAND operation and outputs the result. The first NAND circuit 514 outputs LOW potential if the reset signal has LOW potential and the overvoltage is detected.

The second NAND circuit 516 receives the output signals from the inverter 512 and the latch unit 250, performs a NAND operation and outputs the result. The third NAND circuit 518 receives the output signals from the first NAND circuit 514 and the second NAND circuit 516, performs a NAND operation and outputs the result. The second NAND circuit 516 and the third NAND circuit 518 form a RS flip-flop. More specifically, the second NAND circuit 516 and the third NAND circuit 518 latch, as the set signal, HIGH potential associated with the detected overvoltage input into the set signal input section 252 after the reset signal is input into the reset signal input section 254.

As described above, the latch unit 250 relating to the present embodiment latches the overvoltage detection signal, in response to the overvoltage occurring in the power semiconductor element 210 under such a condition that the control signal has HIGH potential. The latch unit 250 feeds the block signal to the block unit 220. The block unit 220 causes the gate potential of the power semiconductor element 210 to transition to the off-potential in response to that the latch unit 250 has latched the satisfaction of the block requirement.

As described above, the semiconductor apparatus 200 relating to the present embodiment can operate, in response to the control signal fed from outside, as an igniter that can control the currents flowing through the ignition coil 30 while limiting its operation in response to that overvoltage occurs in the power semiconductor element 210. How the semiconductor apparatus 200 operates will be described with reference to FIG. 9.

Figure 9:
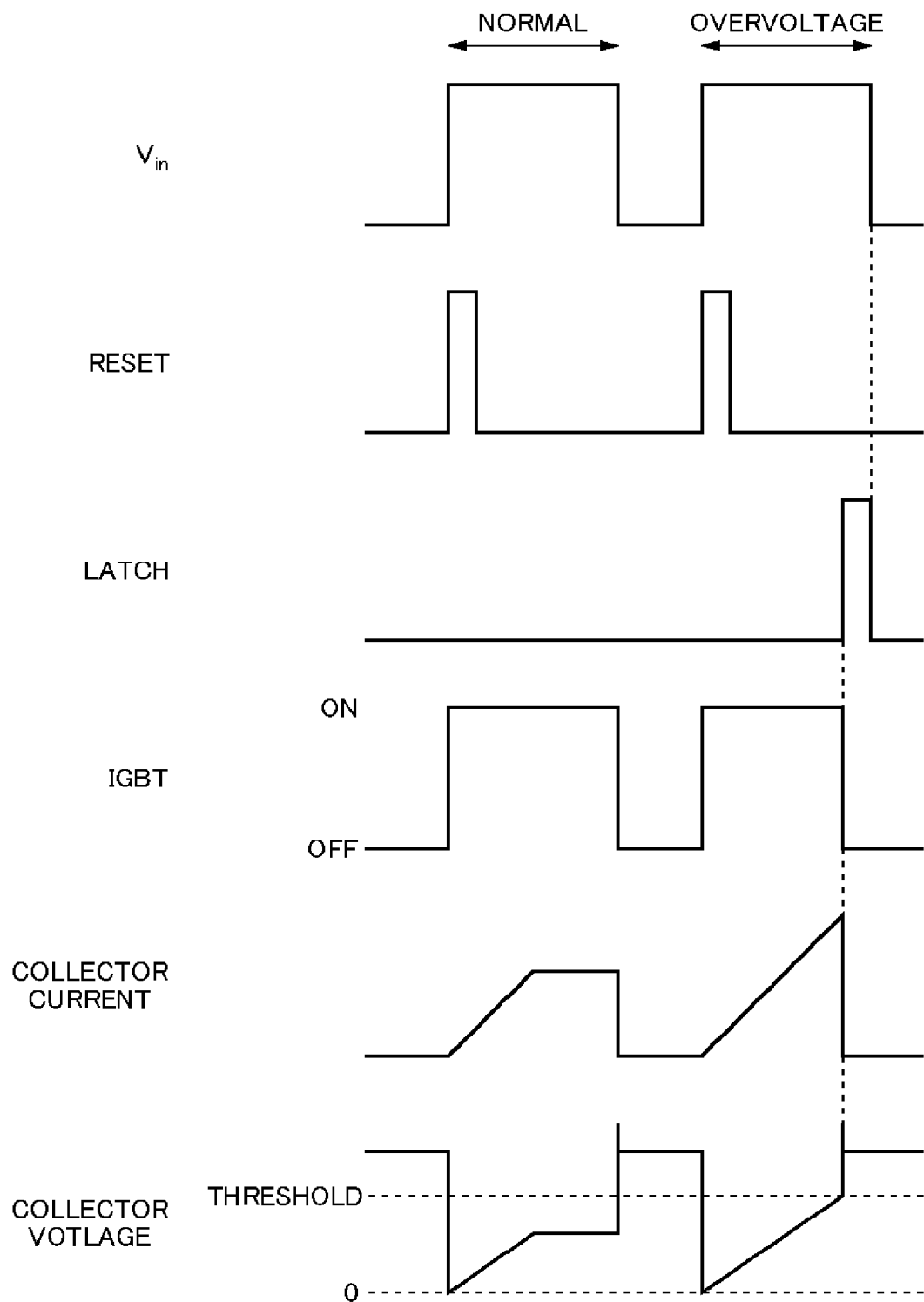
FIG. 9 shows an exemplary waveform illustrating how each component of a semiconductor apparatus 200 operates in accordance with an embodiment of the present invention.

FIG. 9 shows an exemplary waveform illustrating how each component of the semiconductor apparatus 200 relating to the present embodiment operates. In FIG. 9, the horizontal axis represents the time and the vertical axis represents the voltage or current value. In FIG. 9, "Vin" presents the waveform of the control signal input from the control terminal 202, "RESET" presents the waveform of the reset signal output from the reset unit 240, "LATCH" presents the waveform of the block signal output from the latch unit 250, "IGBT" presents whether the power semiconductor element 210 is in the ON or OFF state, "COLLECTOR CURRENT" presents the waveform of the collector-emitter current in the power semiconductor element 210, and "COLLECTOR VOLTAGE" presents the waveform of the collector-emitter voltage in the power semiconductor element 210.

When the control signal Vin input into the semiconductor apparatus 200 has LOW potential (for example 0 V), the reset signal and the block signal have LOW potential (0 V), the power semiconductor element 210 is in the OFF state, the collector current is 0 A, and the collector voltage is equal to the voltage output from the power source 40 (for example, 14 V). Here, if the threshold based on which an overvoltage is determined is less than 14 V, the collector voltage indicates an overvoltage, but the block signal has LOW potential since the control signal has LOW potential.

Once the control signal Vin reaches HIGH potential, the reset signal is output, the power semiconductor element 210 is switched on, the collector current starts to increase, and the collector voltage first reaches substantially 0 V and then starts to increase. For example, the reset unit 240 outputs the reset signal lasting for a period of time that is longer than the period of time from when the control signal that turns on the power semiconductor element 210 is input to when the power semiconductor element 210 is turned on.

In this manner, by the time the reset signal completes the transition from HIGH potential to LOW potential, the power semiconductor element 210 has already entered the ON state and the collector voltage can be equal to or lower than the threshold. Accordingly, even if the overvoltage detector 130 detects an overvoltage at the time of the transition to the ON state in the power semiconductor element 210, the reset signal keeps HIGH potential. At the time when the latch unit 250 starts operating in response to that the reset unit 240 controls the potential of the reset signal to LOW potential, the latch unit 250 outputs the block signal having LOW potential since the collector voltage is equal to or lower than the threshold.

If the control signal Vin again transitions to LOW potential without detection of the overvoltage, the gate potential of the power semiconductor element 210 becomes equal to this LOW potential and the power semiconductor element 210 is thus switched off. In this way, the ignition sequence described with reference to FIG. 1 is performed and the collector current transitions to substantially 0 A and the collector voltage transitions back to the potential output from the power source. During the ignition sequence, the collector voltage instantly rises to a high voltage and then transitions back to the potential output from the power source. The above has described how the semiconductor apparatus 200 operates during the period of time indicated by "NORMAL" above the waveform of the control signal Vin in FIG. 9.

The following describes an exemplary case where overvoltage occurs in the power semiconductor element 210. In this case, until the control signal Vin completes the transition to HIGH potential, the semiconductor apparatus 200 behaves as described above. Specifically, the reset signal is output, the power semiconductor element 210 is switched on, the collector current starts increasing, and the collector voltage reaches substantially 0 V and then starts rising.

If the collector voltage continues to rise due to a problem at the collector terminal of the power semiconductor element 210, the collector current also continues to increase, which causes the temperature of the power semiconductor element 210 to rise. If the collector voltage exceeds the threshold and reaches an overvoltage level, the overvoltage detector 230 detects the overvoltage and the latch unit 250 outputs the block signal. As a result, the power semiconductor element 210 is switched off. In this manner, the ignition sequence described with reference to FIG. 1 is performed, and the collector current transitions back to substantially 0 A and the collector voltage transitions back to the output voltage of the power source.

Once the control signal Vin transitions to LOW potential after the collector current and the collector voltage transition back to the original levels, the block signal transitions to LOW potential since the power supply to the latch unit 250 is blocked. Thus, the initial state is restored. The above has described how the semiconductor apparatus 200 operates during the period of time indicated by "OVERVOLTAGE" above the waveform of the control signal Vin in FIG. 9. As is apparent from the above description, the semiconductor apparatus 200 relating to the present embodiment can still detect application of an overvoltage level to the power semiconductor element 210 and switch off the power semiconductor element 210 without requiring terminals to receive the power source voltage and temperature detector elements. Accordingly, the semiconductor apparatus 200 can be integrated into one chip without requiring a larger chip area. In addition, since the semiconductor apparatus 200 has no temperature detector units, the semiconductor apparatus 200 can eliminate the influence of erroneous detection done by such temperature detector units.

The above description of the semiconductor apparatus 200 relating to the present embodiment is made with reference to an example where the power semiconductor element 210 and the block unit 220 are n-channel MOSFETs. When such a semiconductor apparatus 200 is formed in a substrate, it is preferable that the n-channel switch elements have substantially the same structure. For example, when a vertical semiconductor switch is formed in a substrate, the collector terminal is formed on one of the surfaces of the substrate and the gate and emitter terminals are formed on the other surface. For example, the power semiconductor element 210 includes a collector terminal on the first terminal side formed on a first surface side of the substrate, a gate terminal formed on a second surface side of the substrate and an emitter terminal on the second terminal side formed on the second surface side of the substrate.

In this case, the conductivity type is the n-type on the second surface side of the substrate. Therefore, the block unit 220 is preferably an n-channel MOSFET that is formed on the second surface side of the substrate. In other words, the block unit 220 is preferably formed on the second surface side of the substrate.

If the overvoltage detector 230 includes the depletion-mode MOSFET 340 as shown in FIG. 5, the depletion-mode MOSFET 340 may also have a similar structure. In this case, the drain terminal of the depletion-mode MOSFET 340 is connected to the collector terminal of the power semiconductor element 210. Accordingly, the overvoltage detector 230 includes a semiconductor element that has a collector terminal formed on the first surface side of the substrate, which also serves as the collector terminal of the power semiconductor element 210, and also has a gate terminal and an emitter terminal formed on the second surface side of the substrate, where the gate terminal and the emitter terminal are electrically connected.

Figure 10:
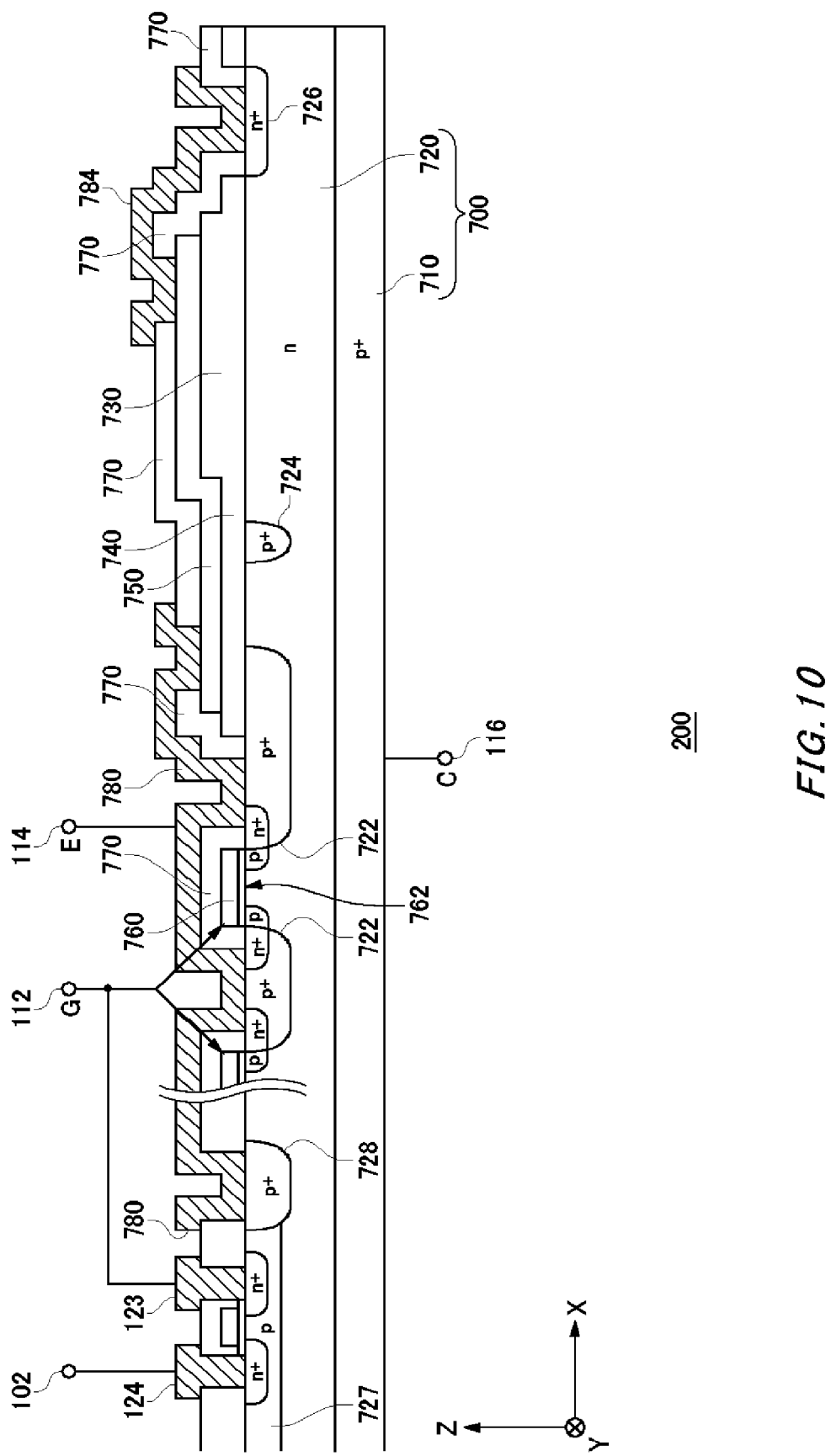
FIG. 10 shows an exemplary structure of part of a substrate having the semiconductor apparatus 200 relating to the embodiment of the present invention formed therein.

The above-described example where the semiconductor apparatus 200 relating to the present embodiment is formed in a substrate will be described with reference to FIG. 10. FIG. 10 shows an exemplary structure of part of a substrate 700 having the semiconductor apparatus 200 formed therein, in accordance with an embodiment of the present invention. FIG. 10 shows an exemplary cross-sectional structure of the power semiconductor element 210 that is included in the semiconductor apparatus 200 and the block unit 220 that is formed as an n-channel MOSFET. Specifically speaking, the power semiconductor element 210 includes a collector terminal 116 formed on a first surface side of the substrate 700, and a gate terminal 112 and an emitter terminal 114 formed on a second surface side of the substrate 700. The block unit 220, which is formed as an n-channel MOSFET, includes a source electrode 123 and a drain electrode 124 on the second surface side of the substrate 700. The semiconductor apparatus 200 establishes and cuts off the vertical electrical connection (in the Z direction) between the emitter terminal 114 and the collector terminal 116, in response to the control signal input into the gate terminal 112.

The semiconductor apparatus 200 is formed using the substrate 700. The substrate 700 has a p$^+$-type layer region 710 and an n-type layer region 720 that is provided on a second surface of the p$^+$-type layer region 710. The substrate 700 is a silicon substrate, for example. As for the substrate 700, the n-type layer region 720 is formed by implanting impurities such as phosphorous or arsenic into a second surface of a p-type substrate doped with boron or the like, for example. FIG. 10 shows an example where a first surface of the substrate 700 indicates the surface that faces the −Z direction and the first surface is defined as substantially parallel to the XY plane. FIG. 10 shows an exemplary structure of the cross-section of the semiconductor apparatus 200 along the XZ plane, which is substantially perpendicular to the first surface. The collector terminal 116 is formed on the p$^+$-type layer region 710 of the substrate 700. Here, a collector electrode may be further formed on the first surface of the substrate 700.

The n-type layer region 720 has a first well region 722, a second well region 724, a third well region 726, a fourth well region 727 and a fifth well region 728 formed therein. In the first well region 722, the emitter region of the power semiconductor element 210 is formed. The n-type layer region 720 has a plurality of first well regions 722 formed therein. The first well region 722 is formed as an electrically conductive p+-type region, for example, and the emitter region, which is an n+-type region, is formed in the p+-type region. The first well region 722, as well as the emitter region, is connected to the emitter terminal 114. Adjacent to the first well region 722, a p-type region having a lower impurity concentration than the first well region 722 may be formed, for example.

The second well region 724 is positioned closer to the edge of the substrate 700 than the first well region 722 is and electrically insulated from the first well region 722. The second well region 724 is, for example, formed so as to surround the region in which the first well region 722 is formed on the second surface side of the substrate 700. The second well region 724 is, for example, shaped like a ring. The second well region 724 is formed as an electrically conductive p+-type region, for example. The second well region 724 forms p-n junction with the n-type layer region 720, which surrounds the second well region 724, and resultantly forms a depletion layer. In this way, the second well region 724 prevents the carriers generated by the high voltage applied to the substrate 700 or the like from flowing toward the first well region 722. The third well region 726 is formed at the periphery of the substrate 700 and electrically connected to the collector terminal 116.

In the fourth well region 727, transistor elements other than the power semiconductor element 210 and the like are formed. The fourth well region 727 is formed as an electrically conductive p+-type region, for example. In this p+-type region, a source region and a drain region are formed to provide n+-type regions forming an n-channel MOSFET, which serves as the block unit 220. Furthermore, the gate of the block unit 220 is formed between the source region and the drain region. The fifth well region 728 is formed so as to surround the fourth well region 727. The fifth well region 728 is formed as an electrically conductive p+-type region, for example. The fourth well region 727 may have a lower impurity concentration than the fifth well region 728, for example.

On the second surface of the n-type layer region 720, a first insulative film 730, a second insulative film 740, a semiconductor film 750, a gate electrode 760, a third insulative film 770, an emitter electrode 780 and an electrode unit 784 are stacked. The first insulative film 730 and the second insulative film 740 are formed on the second surface of the n-type layer region 720. The first insulative film 730 and the second insulative film 740 include, for example, an oxide film. The first insulative film 730 and the second insulative film 740 contain, for example, silicon oxide. The second insulative film 740 is in contact with the first insulative film 730 and thinner than the first insulative film 730.

The semiconductor film 750 is formed on the upper surface of the first insulative film 730 and the second insulative film 740, and connected at one end thereof to the emitter electrode 780 and at the other end thereof to the third well region 726. The semiconductor film 750 is, for example, made of polysilicon. The semiconductor film 750 may have a resistance and/or a diode and the like formed therein. In other words, the semiconductor film 750 is formed between the gate terminal 112 and the emitter terminal 114.

The gate electrode 760 is connected to the gate terminal 112. Here, the gate insulator 762 is formed between the gate electrode 760 and the n-type layer region 720. The third insulative film 770 electrically insulates the emitter electrode 780 and the electrode unit 784, which are stacked after the third insulative film 770 is formed. The third insulative film 770 is, for example, made of boron phosphorous silica glass (BPSG). By etching the third insulative film 770, the substrate 700 is partly exposed, which forms a contact hole.

The emitter electrode 780 is an electrode in contact with the first well region 722. For example, the emitter electrode 780 is formed in the contact hole formed in the third insulative film 770. For example, when a plurality of first well regions 722 are formed in the semiconductor apparatus 200, the emitter electrode 780 is in contact with the plurality of first well regions 722. At least part of the emitter electrode 780 is, for example, the emitter terminal 114. At least part of the emitter electrode 780 may be an electrode pad. When the semiconductor apparatus 200 is housed within a package or the like, at least part of the emitter electrode 780 is electrically connected by means of the wire bonding technique or the like with the terminal provided in the package.

The electrode unit 784 electrically connects the third well region 726 and the semiconductor film 750. The electrode unit 784 is, for example, formed in the contact hole formed in the third insulative film 770 and in contact with the third well region 726.

As described above, FIG. 10 shows an example where the power semiconductor element 210 and the block unit 220 are formed in the substrate 700 as n-channel switches. Accordingly, at least some of the steps of forming the power semiconductor element 210 can also serve as at least some of the steps of forming the block unit 220. This can achieve more efficient process of manufacturing the semiconductor apparatus 200.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor apparatus comprising:
   a power semiconductor element a gate of which is controlled in response to a control signal;
   an overvoltage detector configured to detect that a voltage at a collector terminal of the power semiconductor element reaches an overvoltage level and output an overvoltage detection signal;

a block unit configured to, in response to the detection of the overvoltage level, control the gate of the power semiconductor element to transition to an off-voltage, a reset unit configured to, in response to that the control signal that turns on the power semiconductor element is input, output a reset signal for a predetermined period of time; and a latch unit configured to receive the reset signal outputted by the reset unit and the overvoltage detection signal outputted by the overvoltage detector, be reset in accordance with the reset signal and to latch the detection of the overvoltage level, and to generate a block signal in response to the detection of the overvoltage level, and feed the block signal to a control signal input terminal of the blocking unit, wherein the block unit controls the gate of the power semiconductor element to transition to the off-voltage in response to that the latch unit latches the detection of the overvoltage level.

2. The semiconductor apparatus as set forth in claim 1, wherein the reset unit outputs the reset signal lasting for a period of time longer than a period of time from when the control signal that turns on the power semiconductor element is input to when the power semiconductor element is turned on.

3. The semiconductor apparatus as set forth in claim 1, wherein the block unit pulls down the gate of the power semiconductor element in response to the detection of the overvoltage level.

4. The semiconductor apparatus as set forth in claim 1, wherein the overvoltage detector includes at least one of a zener diode, a depletion-mode MOSFET, and an inverter to generate a threshold voltage based on which the overvoltage level is detected.

5. The semiconductor apparatus as set forth in claim 1, wherein the power semiconductor element includes the collector terminal provided on a first surface side of a substrate and a gate terminal and an emitter terminal provided on a second surface side of the substrate, and the block unit includes a semiconductor element that has a collector terminal formed on the first surface side of the substrate, which also serves as the collector terminal of the power semiconductor element, and also has a gate terminal and an emitter terminal formed on the second surface side of the substrate, where the gate terminal and the emitter terminal are electrically connected.

6. The semiconductor apparatus as set forth in claim 1, wherein the power semiconductor element is an insulated gate bipolar transistor (IGBT) or a vertical MOSFET.

7. The semiconductor apparatus as set forth in claim 1, wherein the semiconductor apparatus is an igniter configured to control a current flowing through an ignition coil in accordance with the control signal.

8. The semiconductor apparatus as set forth in claim 1, wherein the block unit is a switch element, and a gate terminal of the switch element is connected to a terminal for outputting the block signal of the latch unit.

9. The semiconductor apparatus as set forth in claim 1, wherein the block unit consists of a switch element.

\* \* \* \* \*